United States Patent [19]

Lester

[11] Patent Number: 5,100,524

[45] Date of Patent: Mar. 31, 1992

[54] APPARATUS FOR SELECTIVELY COATING PART OF A MEMBER

[75] Inventor: Ronald F. Lester, Chelmsford, United Kingdom

[73] Assignee: The General Electric Company, p.l.c., London, United Kingdom

[21] Appl. No.: 617,969

[22] Filed: Nov. 26, 1990

Related U.S. Application Data

[63] Continuation of Ser. No. 305,260, Feb. 2, 1989, abandoned.

[30] Foreign Application Priority Data

Feb. 3, 1988 [GB] United Kingdom ............... 8802393
Mar. 18, 1988 [GB] United Kingdom ............... 8806544

[51] Int. Cl.⁵ .............................................. C25D 17/00
[52] U.S. Cl. ............................................. 204/224 R
[58] Field of Search ................................. 204/224 R

[56] References Cited

U.S. PATENT DOCUMENTS

| | | | |
|---|---|---|---|
| 3,071,521 | 11/1963 | Ehrhart | 204/15 |
| 3,424,667 | 1/1969 | Frank | 204/24 |
| 3,644,181 | 2/1972 | Donaldson . | |
| 3,798,136 | 3/1974 | Olsen | 204/26 |
| 4,111,761 | 9/1978 | LaBoda | 204/26 |
| 4,445,978 | 5/1984 | Whartenby et al. . | |
| 4,514,264 | 4/1985 | Piepers . | |
| 4,692,222 | 9/1987 | Pellegrino et al. . | |

FOREIGN PATENT DOCUMENTS

| | | |
|---|---|---|
| 0147901 | 7/1985 | European Pat. Off. . |
| 0169456 | 1/1986 | European Pat. Off. . |
| 0194247 | 9/1986 | European Pat. Off. . |
| 0197595 | 10/1986 | European Pat. Off. . |
| 84/01392 | 4/1984 | PCT Int'l Appl. . |
| 1422466 | 1/1976 | United Kingdom . |
| 1569994 | 6/1980 | United Kingdom . |
| 1599832 | 10/1981 | United Kingdom . |
| 2100520 | 12/1982 | United Kingdom . |
| 2143473 | 2/1985 | United Kingdom . |
| 2181743 | 4/1987 | United Kingdom . |

Primary Examiner—T. M. Tufariello
Attorney, Agent, or Firm—Spencer & Frank

[57] ABSTRACT

Apparatus for selectively coating part of a member with a material, such as plating the walls of a hole in a printed circuit board, may include two heads which, during operation of the apparatus, form a passageway between them through the hole. A pump alternately sucks and pumps liquid used in laying down the coating in both directions through the hole. Electrodes may be included in the heads to permit electroplating techniques to be applied in laying down the coating where the material is metallic.

9 Claims, 2 Drawing Sheets

APPARATUS FOR SELECTIVELY COATING PART OF A MEMBER

This application is a continuation of application Ser. No. 07/305,260, filed Feb. 2nd, 1989 now abandoned.

FIELD OF THE INVENTION

This invention relates to apparatus for selectively coating part of a member and is particularly, but not exclusively, of use in metal plating a single hole in a printed circuit board.

BACKGROUND OF THE INVENTION

A typical printed circuit board comprises conductive tracks, usually together with other circuit components, carried by an electrically insulating board. Often, holes extend from one surface of the board to the other and have plated surfaces to permit electrical connections to be made through them. If part of a circuit is damaged, it can often be difficult to effect repairs without causing additional damage to other parts of the circuit. For example, if a hole must be replated, it is difficult to ensure that any replating is confined solely to the desired regions. Also, parts of the circuit may become damaged when they are masked to prevent contamination by plating solutions.

SUMMARY OF THE INVENTION

The present invention arose in an attempt to provide improved apparatus for plating single holes through a multi-layer circuit board but it is believed that the invention has applications in other fields.

According to the invention, there is provided apparatus for selectively coating part of a member with a material, comprising means arranged to cause liquid, used in laying down the coating, to move alternately in opposite directions over the part. By causing the fluid to move in alternate directions, good coverage may be obtained whilst still enabling it to be contained over the desired part. This is because excessive pumping pressures, needed to produce a unidirectional flow, are not required. It is preferred that the apparatus is arranged so that the liquid is sucked in one direction and pumped in the other direction. Then if there is any leak in the path through which the liquid passes, the liquid is not drawn over the part and any tendency for it to leak out are reduced. However, the apparatus may be such that suction pressure is applied to the liquid to cause its movement in one direction and released to allow it to pass in the opposite direction.

The apparatus is particularly useful when it is used to coat a hole and especially a hole which extends from one surface of the member to another. Use of the apparatus is particularly advantageous when the member is a printed circuit board.

Often the coating will be of conductive material and this may conveniently be laid down by using electroplating techniques, the fluid in this case being an electrolyte.

BRIEF DESCRIPTION OF THE DRAWINGS

One way in which the invention may be performed is now described by way of example, with reference to the accompanying drawings, in which.

DESCRIPTION OF THE PREFERRED EMBODIMENT

Figure 1:
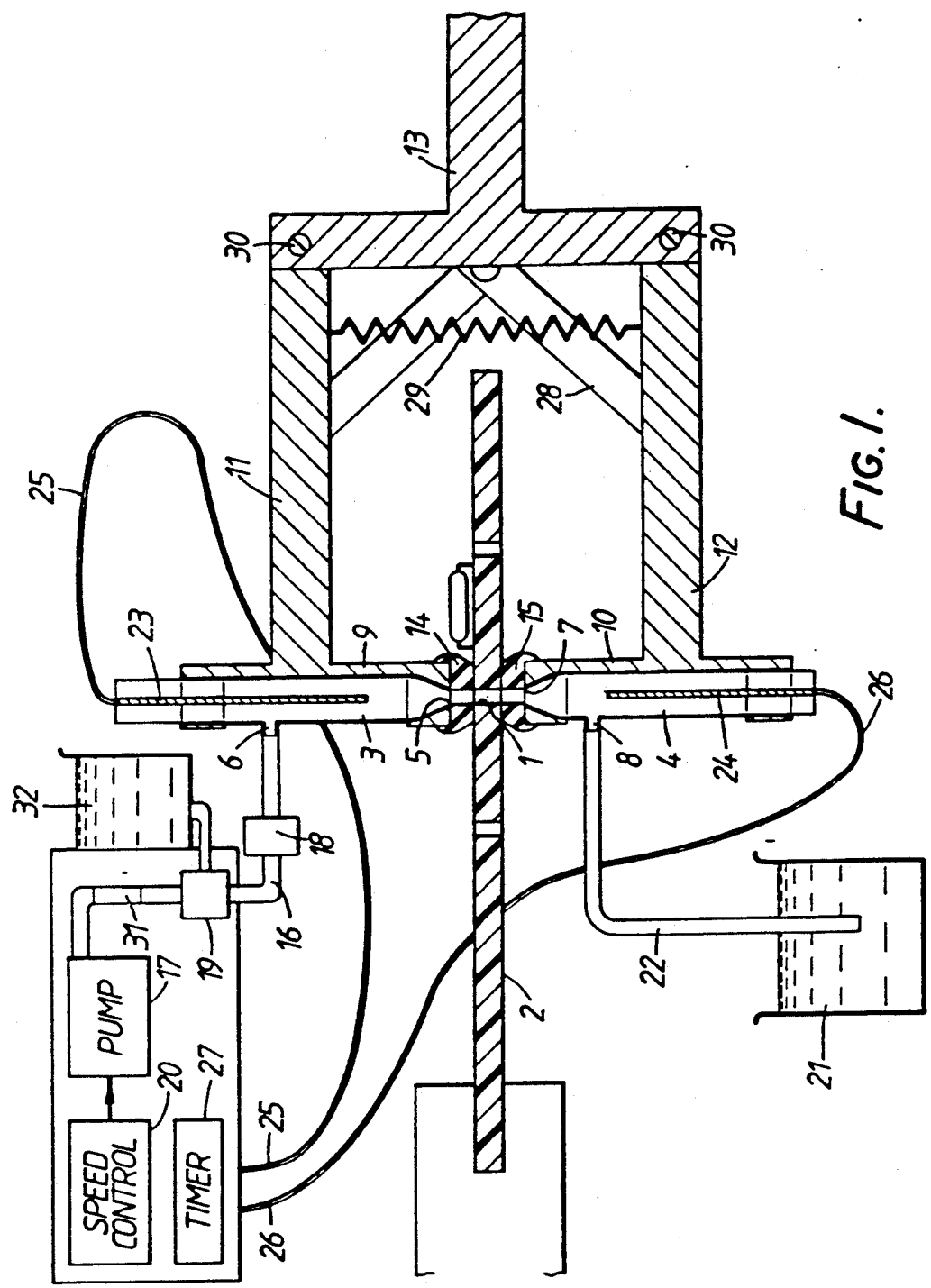
FIG. 1 is a schematic cross-sectional diagram of apparatus in accordance with the invention.

With reference to FIG. 1, apparatus for selectively plating a hole 1 in a printed circuit board 2 includes two heads 3 and 4 arranged one on each side of the board 2. The heads 3 and 4 are hollow, being generally cylindrical in shape, and are of transparent glass. FIG. 1 shows the apparatus in its operational position, the heads 3 and 4 being located such that a fluid is able to pass between them through the hole 1. The head 3 which is positioned above the board 2, as shown, has an opening 5 at its lower end and a side opening 6. The other head 4 is similar, having an opening 7 at its upper end, nearest the board 2 and a side opening 8. The heads 3 and 4 are held by carriers 9 and 10 respectively, from which they can easily be removed to enable them to be interchanged with other heads, as is further described below. The carriers 9 and 10 are supported by arms 11 and 12 which are connected to a rigid support structure 13. Each carrier 9 and 10 has a silicone rubber seal 14 and 15 at its end which is arranged to lie adjacent to the board 2 during operation of the apparatus.

The side opening 6 of the upper head 3 is connected by a flexible pipe 16 to a pump 17 via an adjustable air vent 18 and a valve 19. The pump has two speeds which can be selected by setting a speed controller 20 to enable the most suitable speed to be used for the process being carried out. The side opening 8 of the lower head 4 is connected to a fluid reservoir 21 via a pipe 22. As in the illustrated arrangement, when the plating process desired to be carried out involves electroplating, the chosen heads 3 and 4 include electrodes 23 and 24 which are arranged along the longitudinal axis of the heads 3 and 4 and are connected to a power supply (not shown) via leads 25 and 26 and a timer circuit 27.

Initial alignment of the heads 3 and 4 is achieved by swinging the board 2 into position between the heads 3 and 4 and closing them on the board by means of a lever arm 28. A spring 29 tensions the arms 11 and 12 to give a firm contact between the rubber seals 14 and 15 and the board 2. To obtain more accurate alignment, the fluid reservoir 21 is firstly filled with water and the pump 17 switched on. The pump 17 applies reverse pressure or vacuum and causes water to be sucked up the pipe 22 and into the two heads 3 and 4. The vacuum is then released to allow the water to return in the opposite direction through the hole 1. If there is any misalignment, some leakage occurs through the seals 14 and 15, the amount of leakage being indicative of the degree of alignment achieved. If there is a very bad mismatch then no liquid is drawn up through the hole 1. Adjustment screws 30 are used to achieve the optimum positions for the heads 3 and 4 such that no fluid escapes under the seals 14 and 15. The water is then allowed to drain out of the heads 3 and 4 and into the reservoir 21.

Once correct adjustment has been obtained, the water in reservoir 21 is replaced by an electrolyte. The pump 17 is started and the vacuum alternately applied and released to cause the electrolyte to pass through the hole 1 in alternately the upwards and downwards directions. The electrodes 23 and 24 are connected to act as anodes for electroplating the walls of the hole 1. The timer 27 can be set so that after the time required for laying down the coating, current to the electrodes 25 and 26 is switched off and an alarm alerts the operator.

A gauge 31 is included to give a visible indication should the solution in the heads 3 and 4 reach a level which might be considered undesirable. If an operator sees that this level has been reached, he simply switches off the pump 17 for a short time. The liquid level can be controlled by adjusting the vent 18. By introducing air into the system the level is lowered.

It may be necessary to ensure that the heads 3 and 4 are thoroughly free of one solution when changing to a different one. In this case, the valve 19 is operated to enable a clensing solution, such as water, from a reservoir 32 to pass through the system.

In another method, a silver loaded conductive epoxy, for example, is laid down mechanically on the wall of the hole 1. The apparatus shown in FIG. 1 is then used to electroplate the initial coating.

Figure 2:
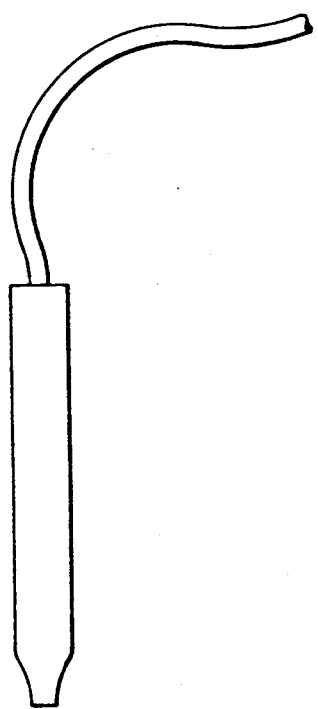
FIGS. 2 and 3 schematically illustrate interchangeable parts of the apparatus shown in FIG. 1.

The heads 3 and 4 are interchangeable with other types of heads which are selected in accordance with the type of coating process and the part to be coated. FIG. 2 illustrates a head which may be used in a deposition method which does not use electrodes. This type of head may be used in place of the heads 3 and 4 shown in FIG. 1. After a hole which is to be repaired has been drilled out and cleaned, the board is positioned between two heads similar to that shown in FIG. 2 and electroless plating carried out. The heads are then replaced by those having electrodes, as illustrated in FIG. 1, and the final copper plating step carried out.

Figure 3:
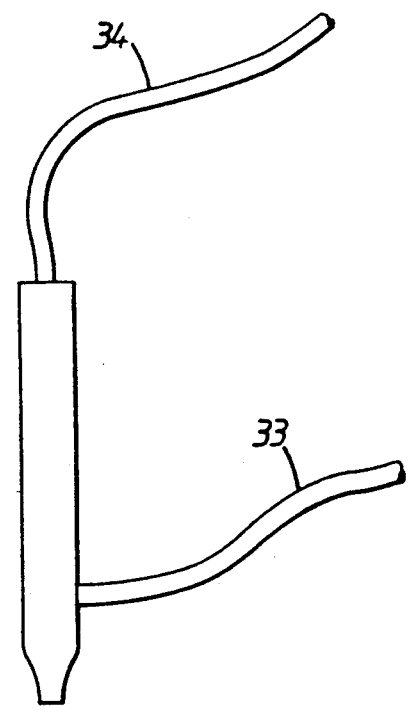

In another technique, which is useful for blind hole plating, another plating head, shown in FIG. 3, is used in the top head carrier 9. The lower head shown in FIG. 1 may be included, or support for the underside of the board 2 may be provided by the carrier 10 alone. Fluid is drawn from a reservoir along a flexible pipe 33 which is connected to a side opening in the head, and another pipe 34 is connected to the pump.

It is possible using apparatus in accordance with the invention to plate very small holes without damaging surrounding parts of the printed circuit board. It may be necessary to remove components carried by the board but in many cases the seal may be made small enough to cover very little more than the area required to be plated.

I claim:

1. Apparatus for selectively plating a material on to the wall of a hole in a printed circuit board, comprising first and second hollow cylindrical heads positioned on opposite sides of said board with the hole interposed therebetween, each of said heads containing an electrode for electroplating the wall of said hole when said electrodes are energized;

pumping means attached to said heads, said pumping means alternately applying suction to produce movement of a plating fluid through said heads in one direction and releasing suction to allow movement of said plating fluid through said heads in the opposite direction;

first and second carrier members securing said first and second heads respectively to a rigid support structure, each of said carrier members having a resilient portion at an end adjacent said board; and tensioning means secured to said carrier members for sealing the resilient portions of said carrier members to said board during operation of said apparatus, said apparatus enabling the plating of very small holes without damaging surrounding parts of said printed circuit board.

2. Apparatus as claimed in claim 1 wherein said hole extends from one surface of said printed circuit board to another.

3. Apparatus as claimed in claim 1 wherein said material is electrically conductive.

4. Apparatus as claimed in claim 3 wherein said fluid is an electrolyte.

5. Apparatus as claimed in claim 1 including timing means controlling the duration of current passed through said electrode.

6. Apparatus as claimed in claim 1 wherein said heads are removably held by said carrier members and are interchangeable with other heads.

7. Apparatus as claimed in claim 1 further comprising means for changing the speed of movement of said fluid over said printed circuit board.

8. Apparatus as claimed in claim 1 further comprising means for controlling the movement of said fluid, said means including vent means for introducing gas into conduits through which said fluid moves.

9. Apparatus as claimed in claim 1 further comprising means for controlling the movement of said fluid, said means including level detector means for monitoring the level of said fluid.

* * * * *